(12) United States Patent
Vlack et al.

(10) Patent No.: US 9,934,305 B2
(45) Date of Patent: Apr. 3, 2018

(54) SYSTEM AND METHOD FOR FINGERPRINTING DATASETS

(71) Applicant: Interactive Intelligence, Inc., Indianapolis, IN (US)

(72) Inventors: Kevin Vlack, Ballwin, MO (US); Felix Immanuel Wyss, Zionsville, IN (US)

(73) Assignee: Interactive Intelligence Group, Inc., Indianapolis, IN (US)

( * ) Notice: Subject to any disclaimer, the term of this patent is extended or adjusted under 35 U.S.C. 154(b) by 783 days.

(21) Appl. No.: 14/169,211

(22) Filed: Jan. 31, 2014

(65) Prior Publication Data

US 2014/0149120 A1 May 29, 2014

Related U.S. Application Data

(63) Continuation of application No. 13/432,838, filed on Mar. 28, 2012, now Pat. No. 8,681,950.

(51) Int. Cl.
| | | |
|---|---|---|
| G06F 17/30 | (2006.01) | |
| G10L 25/54 | (2013.01) | |
| G10L 19/018 | (2013.01) | |
| H03M 7/30 | (2006.01) | |
| H04M 3/51 | (2006.01) | |

(52) U.S. Cl.
CPC .. *G06F 17/30595* (2013.01); *G06F 17/30743* (2013.01); *G10L 19/018* (2013.01); *G10L 25/54* (2013.01); *H03M 7/3059* (2013.01); *H03M 7/3066* (2013.01); *H03M 7/3082* (2013.01); *H04M 3/5158* (2013.01); *H04M 2203/2027* (2013.01)

(58) Field of Classification Search
CPC ..................................................... G10L 19/018
USPC ................... 704/270, 217; 709/203; 725/19; 700/94; 379/266.07
See application file for complete search history.

(56) References Cited

U.S. PATENT DOCUMENTS

| 4,697,209 A | * | 9/1987 | Kiewit ............... G06K 9/00711 |
| | | | 725/19 |
| 4,941,168 A | | 7/1990 | Kelly, Jr. |

(Continued)

FOREIGN PATENT DOCUMENTS

| GB | 2487734 A | 8/2012 |
| IN | 1939/DEL/2004 | 7/2006 |

OTHER PUBLICATIONS

European Search Report dated Feb. 3, 2016 for related International Application PCT/US2013/028788, filed Mar. 4, 2013, European Application No. 13768137.5.

(Continued)

*Primary Examiner* — Md S Elahee
(74) *Attorney, Agent, or Firm* — Lewis Roca Rothgerber Christie LLP (57) ABSTRACT

Systems and methods for the matching of datasets, such as input audio segments, with known datasets in a database are disclosed. In an illustrative embodiment, the use of the presently disclosed systems and methods is described in conjunction with recognizing known network message recordings encountered during an outbound telephone call. The methodologies include creation of a ternary fingerprint bitmap to make the comparison process more efficient. Also disclosed are automated methodologies for creating the database of known datasets from a larger collection of datasets.

8 Claims, 10 Drawing Sheets

(56) References Cited

U.S. PATENT DOCUMENTS

| | | | |
|---|---|---|---|
| 5,007,000 | A | 4/1991 | Baldi |
| 5,404,400 | A | 4/1995 | Hamilton |
| 5,581,602 | A | 12/1996 | Szlam et al. |
| 5,724,420 | A | 3/1998 | Torgrim |
| 6,208,970 | B1 | 3/2001 | Ramanan |
| 7,080,253 | B2 | 7/2006 | Weare |
| 7,127,058 | B2 | 10/2006 | O'Connor et al. |
| 7,184,521 | B2 | 2/2007 | Sikora et al. |
| 7,190,768 | B2 | 3/2007 | Roby |
| 7,346,512 | B2 | 3/2008 | Li-Chun Wang et al. |
| 7,359,889 | B2 | 4/2008 | Wang et al. |
| 7,386,101 | B2 | 6/2008 | Pugliese |
| 7,457,396 | B2 | 11/2008 | Claudatos et al. |
| 7,555,114 | B1 | 6/2009 | Stahr |
| 7,734,032 | B1 | 6/2010 | Kiefhaber et al. |
| 7,949,104 | B1 | 5/2011 | Tuttle |
| 8,036,374 | B2 | 10/2011 | Noble, Jr. |
| 2003/0204404 | A1 | 10/2003 | Weldon et al. |
| 2004/0010412 | A1 | 1/2004 | Chiu |
| 2004/0037397 | A1 | 2/2004 | Roby |
| 2004/0073431 | A1 | 4/2004 | Galanes et al. |
| 2005/0234727 | A1 | 10/2005 | Chiu |
| 2006/0013451 | A1 | 1/2006 | Haitsma |
| 2006/0104433 | A1* | 5/2006 | Simpson ............. H04M 3/5158 379/266.07 |
| 2006/0155399 | A1 | 7/2006 | Ward |
| 2006/0277047 | A1 | 12/2006 | DeBusk et al. |
| 2007/0055500 | A1* | 3/2007 | Bilobrov ........... G06F 17/30743 704/217 |
| 2007/0192087 | A1 | 8/2007 | Kim et al. |
| 2008/0066098 | A1 | 3/2008 | Witteman et al. |
| 2008/0086311 | A1 | 4/2008 | Conwell et al. |
| 2009/0052641 | A1 | 2/2009 | Taylor et al. |
| 2009/0083228 | A1 | 3/2009 | Shatz et al. |
| 2009/0144131 | A1 | 6/2009 | Chiu et al. |
| 2009/0259690 | A1 | 10/2009 | Bogdanov |
| 2010/0023328 | A1 | 1/2010 | Griffin, Jr. et al. |
| 2010/0202440 | A1 | 8/2010 | Hillis et al. |
| 2010/0205174 | A1 | 8/2010 | Jiang et al. |
| 2010/0322469 | A1 | 12/2010 | Sharma |
| 2011/0026763 | A1 | 2/2011 | Diggins |
| 2011/0182283 | A1 | 7/2011 | Van Buren et al. |
| 2011/0185176 | A1 | 7/2011 | Takahashi et al. |
| 2011/0188704 | A1 | 8/2011 | Radhakrishnan et al. |
| 2011/0276157 | A1 | 11/2011 | Wang et al. |
| 2012/0239175 | A1* | 9/2012 | Mohajer ........... G06F 17/30743 700/94 |
| 2016/0006841 | A1* | 1/2016 | Gurevich ................ G06F 21/30 709/203 |

OTHER PUBLICATIONS

Chilean Search Report, dated Mar. 10, 2016 by Applicant for related International Application PCT/US2013/028788, filed Mar. 4, 2013, Chilean Application No. 02551-2014.

Sharmistha Sarkar Das, et al: "Application of automatic speech recognition in call classification", 2002 IEEE International Conference on Acoustics, Speech, and Signal Processing. Proceedings. (ICASSP). Orlando, FL, May 13-17, 2002.

International Search Report dated Jul. 19, 2013 for related International Application PCT/US2013/028788, filed Mar. 4, 2013.

Sukthankar et al. Semantic Learning for Audio Applications: A Computer Vision Approach. CVPRW'06 [retrieved on Jun. 19, 2013]. Retrieved from the internet: <URL: http://swing.adm.ri.cmu.edu/pub_files/pub4/sukthankar_rahul_2006_1/sukthankar_rahul_2006_1.pdf> entire document.

Boogaart et al. Audio Brush: A Tool for Computer-Assisted Smart Audio Editing. AMCMM'06. Oct. 27, 2006 [ retrieved on Jun. 18, 2013]. Retrieved from the Internet: <URL: http://www.multimedia-coputing.de/mediawlki/images/0/0d/AMCMM2006_Boogaart.pdf> entire document.

P. Cano and E. Battle, A Review of Audio Fingerprinting, Journal of VLSI Signal Processing 41, pp. 271-284, 2005, Springer Science+Business Media.

Haitsma J et al: "A Highly Robust Audio Fingerprinting System", Internet Citation, 2002, XP002324866, Retrieved from the Internet: URL: http://ismir2002.ismir.net/proceedings/02-FP04-2.pdf.

Richly G et al: "Short-term sound stream characterization for reliable, real-time occurrence monitoring of given sound-prints", Electrotechnical Conference, 2000, Melecon 2000, 10th Mediterranean May 29-31, 2000, Piscataway, NJ, USA, IEEE, vol. 2, May 29, 2000 (May 29, 2000). ISBN: 978-0-7803-6290-1.

Extended European Search Report dated Jun. 29, 2016 for related European Patent Application 16169776.8.

Extended European Search Report dated Jul. 5, 2016 for related European Patent Application 16169777.6.

Regunathan, Radhakrishnan, et al: "Audio Signature Extraction Based on Projections of Spectrograms", Multimedia and Expo, 2007 IEEE International Conference on, IEEE, PI, Jul. 1, 2007 (Jul. 1, 2007), pp. 2110-2113.

G. Kremser, M. Schmucker: "Perceptual Hashing of Sheet Music based on Graphical Representation", SPIE, PO Box 10 Bellingham, WA 98227-0010, USA.

* cited by examiner

SYSTEM AND METHOD FOR FINGERPRINTING DATASETS

CROSS-REFERENCE TO RELATED APPLICATIONS

The present application is a continuation of U.S. patent application Ser. No. 13/432,838, filed on Mar. 28, 2012, now allowed, and titled SYSTEM AND METHOD FOR FINGERPRINTING DATASETS. The disclosure of the prior application is considered part of and is incorporated by reference in the disclosure of this application.

TECHNICAL FIELD OF THE DISCLOSED EMBODIMENTS

The present invention generally relates to identifying known datasets, such as audio signals and, more particularly, to systems and methods for fingerprinting datasets.

BACKGROUND OF THE DISCLOSED EMBODIMENTS

The background of the present disclosure and the illustrative embodiments disclosed herein are described in the context of identifying known audio recordings encountered during an outbound telephone call, for example during a call placed from a contact center. However, the present invention has applicability to the identification of any segment of audio or an image (as used herein, the term "image" is intended to encompass both still and moving images), regardless of the type or source of the audio or image, and regardless of in what circumstances the audio or image is encountered. Furthermore, the present invention also has applicability to the identification of any segment of data such as, for example, data obtained from any type of sensor. Therefore, as used herein, the term "dataset" shall encompass a collection of any type of data, whether comprising audio, image, or other type of data.

In a classic contact center scenario, outbound calls are made either automatically (by a class of devices known as "automated dialers" or "autodialers") or manually. A number of human "agents" are available to join into calls that are determined to reach a live person at the called end. In this way, efficiencies are obtained by not having agents involved in a call until it is determined that there is a live person at the called end with whom the agent may speak. The use of automated equipment to monitor the telephone line during the outbound call is referred to as call progress analysis (CPA). CPA is a class of algorithms that operate on audio and network signaling during call setup. The goal of CPA is to determine the nature of the callee, or the outcome of call setup to an external network (traditional public switched telephone network or Voice over Internet Protocol (VoIP)). Specifically, when a call or session is being established, the caller or initiator must determine whether it was answered by a live speaker, if the line is busy, etc. When the caller is an automated application, such as an automated dialer or message broadcasting system, CPA algorithms are used to perform the classification automatically. CPA is used to interpret so-called call-progress tones, such as ring back and busy, that are delivered by the telephone network to the calling entity. Traditional CPA is performed using low- and high-pass frequency discriminators together with energy measurements over time to qualify in-band signaling tones. Another method for classifying audio on an outbound call is known as Voice Activity Detection (VAD), which is a class of audio processing algorithms that identify where speech is present in an audio stream. The detected speech may originate from any source, including a live speaker or a prerecorded message. Modern VAD algorithms use spectral analysis to distinguish the utterance of a primary speaker from background noise.

A subclass of CPA algorithms that extract speaking patterns using VAD, and determine whether the patterns originate from a live speaker or a prerecorded message, is known as Answering Machine Detection (AMD). By identifying calls that do not connect to a live speaker, an accurate AMD algorithm can significantly increase throughput of an automated dialer. However, false positives from AMD lead to silent or abandoned calls, causing revenue loss for the contact center, and negative impressions amongst the public. The quality of an AMD algorithm is a function of the accuracy and response time, and some regions of the world (notably the U.S. and U.K.) impose strict legal requirements on both.

AMD is not an exact science, and the optimal approach is an open problem. To achieve acceptable accuracy, speed, and flexibility, AMD algorithms use a combination of heuristics and statistical models such as neural networks to classify an utterance as live or pre-recorded. Although many commercial AMD systems available on the market report high accuracy rates in the marketing literature (e.g., 95% or more), there is no independent auditor for these figures, and the actual accuracy rate is typically much lower in practice (e.g., 80% or less), as reflected by continued widespread complaints. A general ban has been proposed by some consumer advocacy groups, and some contact centers simply cannot use AMD because of its limitations.

A relatively new science of audio identification is known as Acoustic Fingerprinting, in which a system generates a "fingerprint" of a candidate audio stream, and compares it against a database of known fingerprints, analogous to human fingerprinting used in forensics. In this context, a "fingerprint" is a condensed digest of an audio stream that can quickly establish perceptual equality with other audio streams. A database of known fingerprints may associate known fingerprints with meta-data such as "title", "artist", etc. The past ten years have seen a rapidly growing scientific and industrial interest in fingerprinting technology for audio and images. Applications include identifying songs and advertisements, media library management, and copyright compliance.

Various acoustic fingerprinting algorithm classes have been proposed, and the most prevalent today are those based on either "landmarks" or "bitmaps". Landmark-based algorithms extract discrete features from an audio stream called "landmarks", such as spectral peaks, sudden changes in tone, pitch, loudness, etc. The optimal choice of landmark is an open question guided mostly by heuristics. The acoustic fingerprint is stored as a sequence of data structures that describe each landmark. At runtime, landmarks extracted from a candidate audio stream are compared to a database of fingerprints based on a distance metric.

Figure 1A:
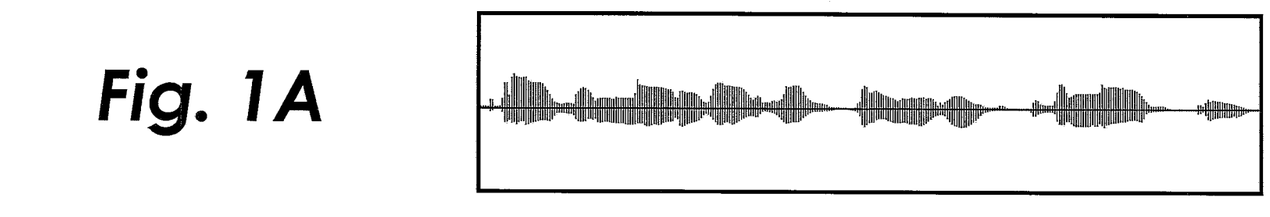
FIGS. 1A-C are an audio wave, spectrogram and binary acoustic fingerprint bitmap, respectively.
Figure 1B:
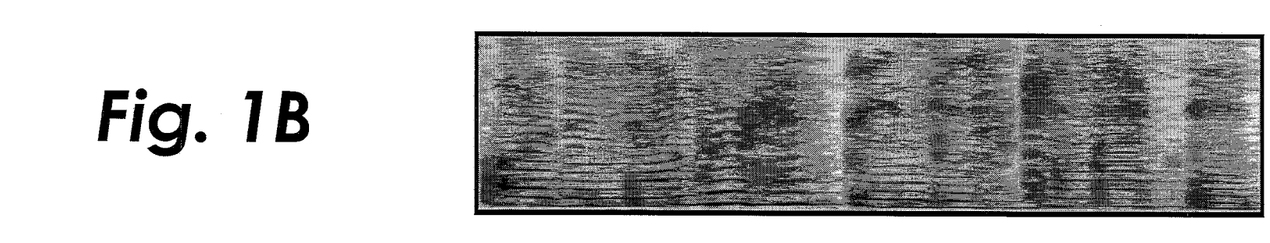
Figure 1C:
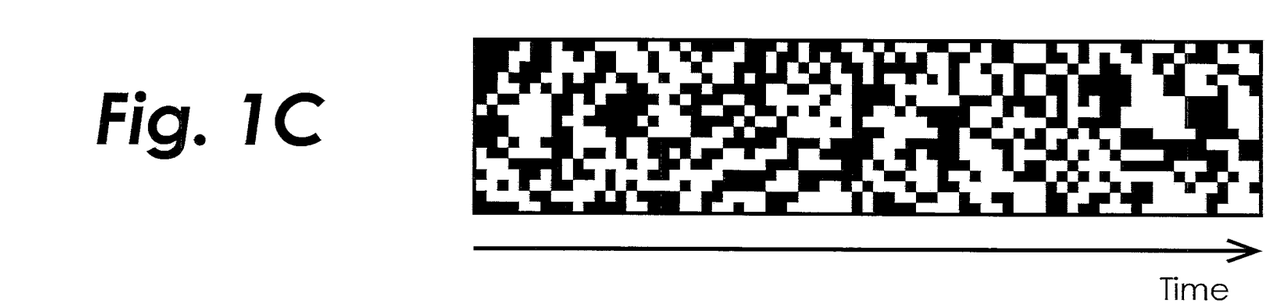

Bitmap-based algorithms analyze an audio stream as a sequence of frames, and use a filter bank to quantize each frame into a bit vector of size N, where N is typically chosen for convenience as the number of bits in a C-style integer, e.g. $N \in \{8, 16, 32, \text{ or } 64\}$. A popular and well-studied example is known as the "Haitsma-Kalker algorithm", which computes a binary bitmap using a filter that compares short-term differences in both time and frequency. The Haitsma-Kalker Algorithm has been well-studied in the literature. It's inventors, Jaap Haitsma and Ton Kalker, have published a report of use of the Haitsma-Kalker Algorithm and the comparison of binary acoustic fingerprint bitmaps to identify three (3) second recordings of songs from a database of millions of songs (Haitsma and Kalker, "A Highly Robust Audio Fingerprinting System," *Journal of New Music Research*, Vol. 32, No. 2 (2003), pp. 211-221). The complete acoustic fingerprint is stored as a sequence of bit vectors, or a bitmap. As illustrated in FIG. 1A-C, there are shown three images of an audio stream containing a message from a telephone network saying "This number has been disconnected". FIG. 1A shows the original audio wave signal, with 1.5 seconds of audio sampled at 8000 KHz. FIG. 1B shows a spectrogram of the original audio input signal, with dark regions indicating high energy at a particular frequency. FIG. 1C shows a binary acoustic fingerprint bitmap created using the Haitsma-Kalker algorithm, with height N=16. The height is determined by the number of bits computed at each frame, and the width is determined by the number of frames in the audio stream. At runtime, the bitmap computed from a candidate audio stream is compared to a database of bitmaps based on the number of non-matching bits, also known as the Hamming distance.

The use of bitmap matching and the process of acoustic fingerprinting is a powerful emerging tool in the science of audio recognition; however, it is computationally intense and requires several seconds of sampled audio to make a match in many cases. This delay makes it not well suited for use in call progress analysis. Accordingly, there remains a need for faster and more accurate systems and methods for identifying audio, both in the general case and during an outbound call attempt.

SUMMARY OF THE DISCLOSED EMBODIMENTS

Systems and methods for the matching of datasets, such as input audio segments, with known datasets in a database are disclosed. In an illustrative embodiment, the use of the presently disclosed systems and methods is described in conjunction with recognizing known network message recordings encountered during an outbound telephone call. The methodologies include creation of a ternary fingerprint bitmap to make the comparison process more efficient. Also disclosed are automated methodologies for creating the database of known datasets from a larger collection of datasets.

In one embodiment, a method for matching an audio stream is disclosed, the method comprising the steps of: a) generating a collection of ternary acoustic fingerprint bitmaps; b) subdividing each ternary acoustic fingerprint bitmap into a plurality of segments; c) obtaining a hash key from each segment; and d) aggregating obtained hash keys from the ternary acoustic fingerprint bitmaps into a lookup table.

In another embodiment, a method for extracting fingerprints for common recordings is disclosed, the method comprising the steps of: a) identifying segments of interest from a dataset of recordings by a means of classification; b) generating fingerprint candidates for said identified segments; c) adding said fingerprint candidates to an acoustic fingerprint database; d) repeating steps (a) and (b) to process the recordings in the dataset using the fingerprint database containing said fingerprint candidates added in step (c); and e) removing fingerprint candidates from the database that were not detected a specified number of times.

In a further embodiment, a method for extracting fingerprints for common data is disclosed, the method comprising the steps of: a) identifying subsets of interest from a dataset by means of classification; b) generating fingerprint candidates for said subsets; c) adding said fingerprint candidates to a database; d) repeating steps (a) and (b) to process the dataset using the database in step (c) containing the additions of fingerprint candidates; and e) removing fingerprint candidates from the database that do not meet a specified criteria.

Other embodiments are also disclosed.

DETAILED DESCRIPTION OF THE DISCLOSED EMBODIMENTS

For the purposes of promoting an understanding of the principles of the invention, reference will now be made to the embodiment illustrated in the drawings, and specific language will be used to describe that embodiment. It will nevertheless be understood that no limitation of the scope of the invention is intended. Alterations and modifications in the illustrated systems and methods, and further applications of the principles of the invention as illustrated therein, as would normally occur to one skilled in the art to which the invention relates are contemplated, are desired to be protected. Such alternative embodiments require certain adaptations to the embodiments discussed herein that would be obvious to those skilled in the art.

Although the various embodiments disclosed herein will be described in the context of identifying known recordings encountered during an outbound telephone call, for example during a call placed from a contact center, the present invention has applicability to the identification of any segment of audio, image, or other type of data, regardless of the type or source of the audio, image, or other type of data, and regardless of in what circumstances the audio, image, or other type of data is encountered. Additionally, the present invention has applicability to the recognition of any type of dataset having two or more dimensions. The predominant reliance on the recognition of audio recordings herein is simply for convenience of description.

The Use of Acoustic Fingerprinting in a Call Progress Analysis System.

Call Progress Analysis may be improved by using a system that augments conventional AMD with an acoustic fingerprinting system to identify specific call progress events of interest including, but not limited to:

a. Telephone network messages (e.g., "We're sorry"; "The number or code you have dialed is incorrect")
    b. Voicemail greetings shared by multiple subscribers (e.g., "Hello, the party you have dialed")
    c. Colored tones, jingles, chimes
    d. Ringback tones containing music or speech (e.g., "Please hold while your call is completed")
    e. Call screeners
    f. Privacy managers (e.g., "You have reached a number that does not accept solicitations")
    g. Interactive Voice Response (IVR) prompts These are collectively referred to herein as "network messages." All such network messages share the common trait that the same audio is used by the network in certain situations for calls placed to multiple called parties. Therefore, a dialing program should expect to encounter these network messages in the future, and identifying them as such will help the call progress analysis software determine that a live speaker has not been reached. It is desired that the call progress analysis software exhibit the following characteristics:

1. Efficient (low use of CPU and memory)
    2. Fast (low latency and delay)
    3. Robust (low rate of false negatives)
    4. Accurate (low rate of false positives)
    5. Scalable (low lookup cost)
    6. Repeatable (low learning curve)

In one embodiment, during the real-time progress of an outbound call, the CPA system processes the audio stream using both a conventional AMD algorithm and an acoustic fingerprinting system. As the audio proceeds, the acoustic fingerprinting system identifies whether there is a likely match in the database of acoustic fingerprints of known network messages. If so, any output from the AMD algorithm is preempted: instead, the CPA system reports specific call progress events based on the matched acoustic fingerprint. For the general case where the acoustic fingerprint system finds no matches in the database, the conventional AMD algorithm is used to detect a greeting, and report the event of either a live speaker or an answering machine. All events are interpreted by the user of the CPA system to choose an appropriate response, such as whether to proceed or terminate the call, dispatch to an agent, adjust the dialer plan, etc. In other embodiments, the acoustic fingerprinting system is used without an additional CPA mechanism.

Figure 2:
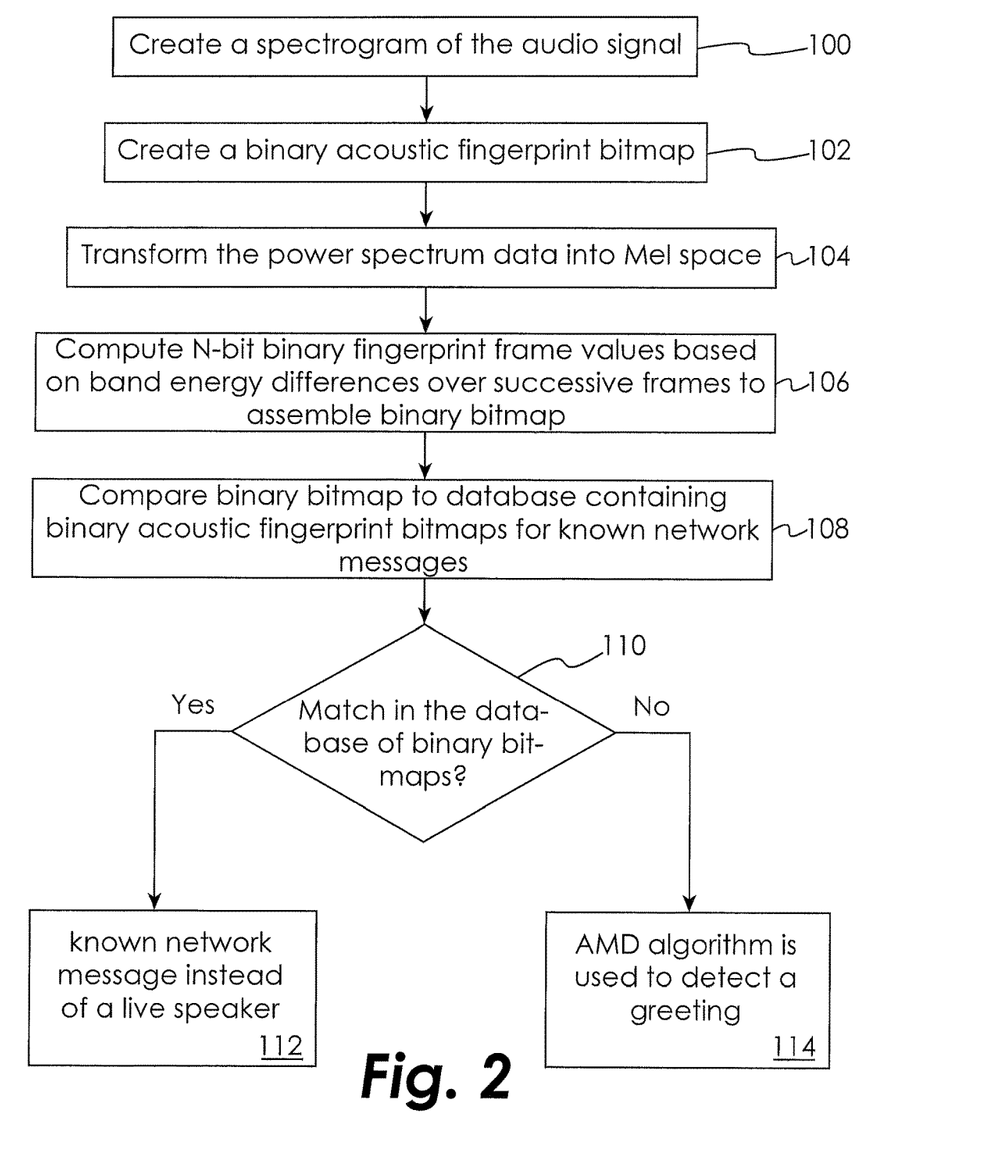
FIG. 2 is a schematic flow diagram of one embodiment of a method for building an acoustic fingerprint.
Figure 3A:
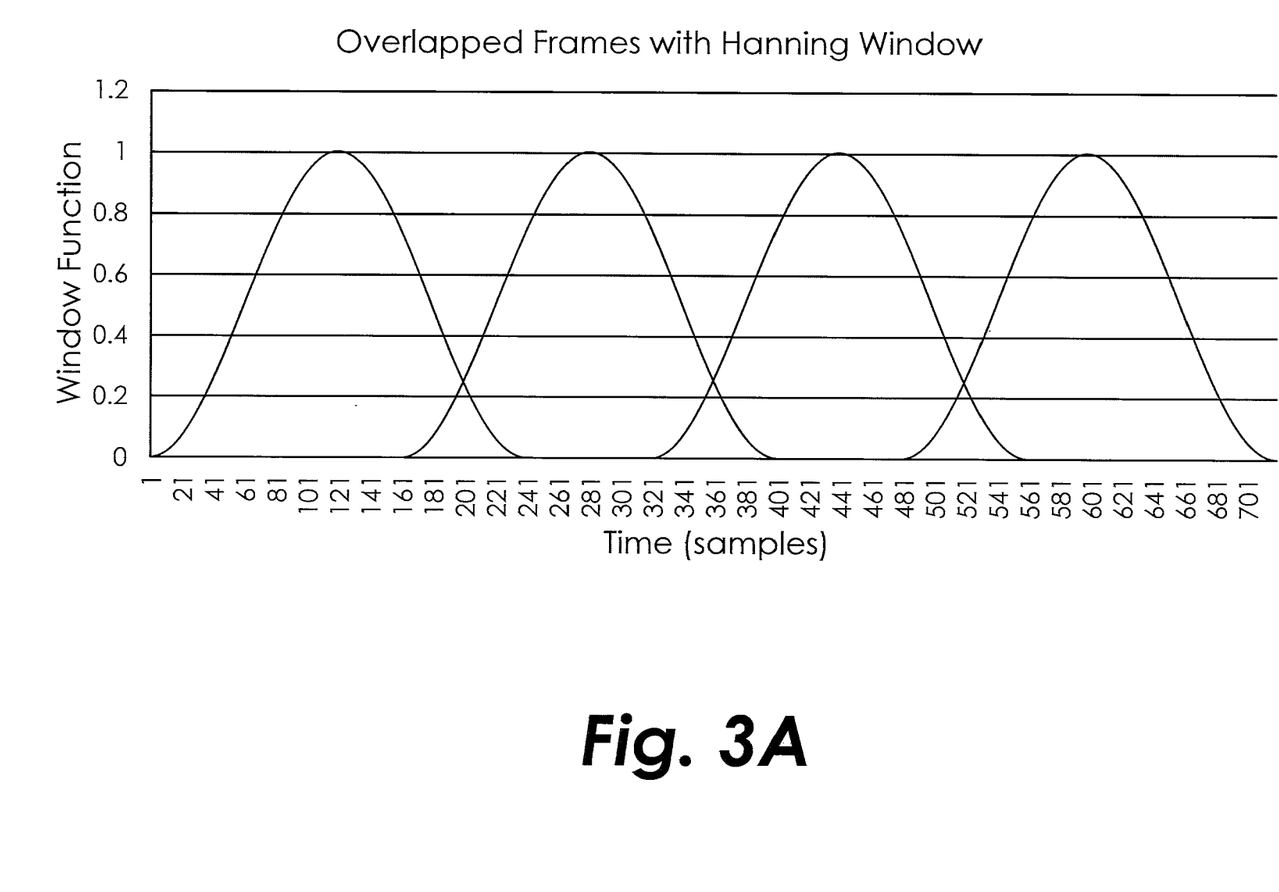
FIG. 3A is a graph of amplitude vs. time for a set of exemplary sliding windows used in a transformation according to one embodiment.

FIG. 2 schematically illustrates one embodiment of a method for building an acoustic fingerprint. In order to build an acoustic fingerprint, either of a known audio segment or of a candidate audio segment from a current telephone call, a time varying spectral representation of the signal (referred to herein as a "spectrogram") is created (as indicated at step 100) using any desired transform, such as Discrete Fourier Transform (DFT), Discrete Cosine Transform (DCT), wavelet transform, or even just a set of filter banks, to name just four non-limiting examples. At each frame, the power spectrum in frequency space is computed. For example, FIG. 3A illustrates amplitude vs. time for the sliding windows used in a Fast Fourier Transform (FFT, a particularly efficient algorithm to implement Discrete Fourier Transform) of an audio sample using the following parameters:

Sample rate: 8 kHz
    Frame duration: 30 milliseconds
    Step size: 20 milliseconds
    Overlap: ⅓
    FFT size: 256

Figure 3B:
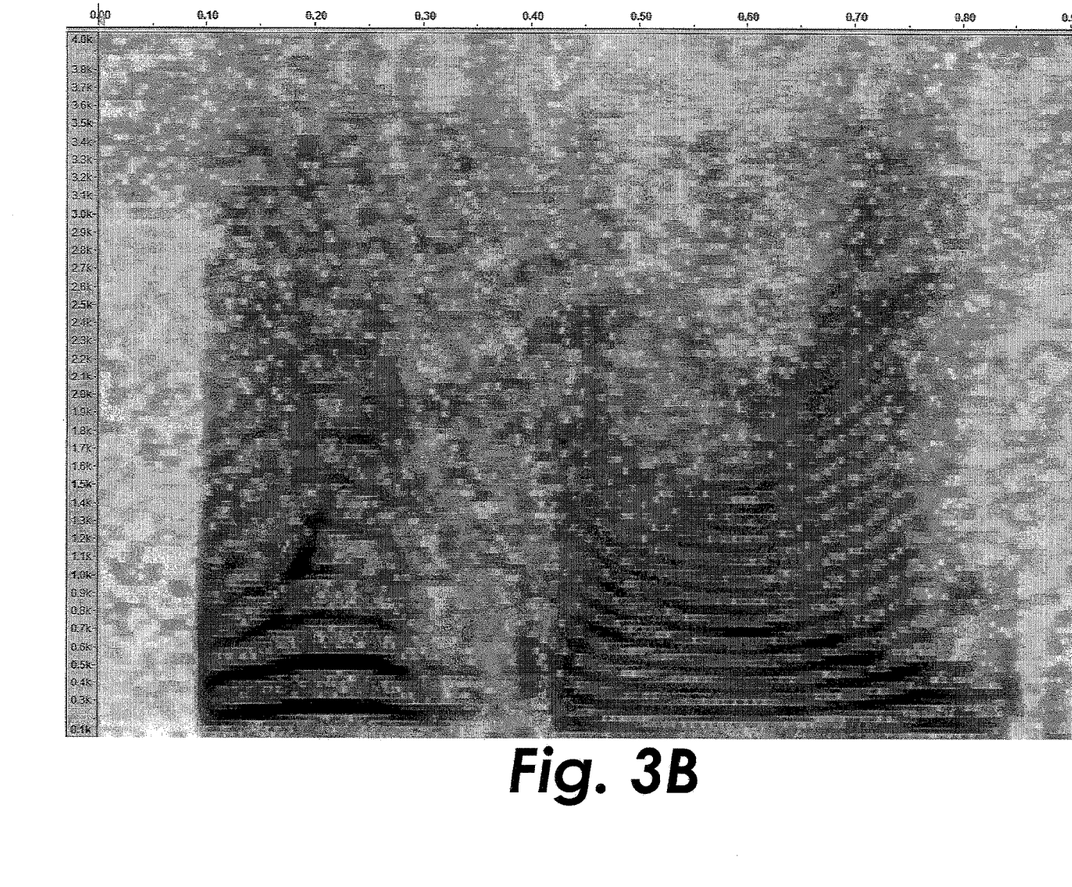
FIG. 3B is a spectrogram of an audio sample.

A sample spectrogram of an audio sample using this technique is illustrated in FIG. 3B.

Figure 4:
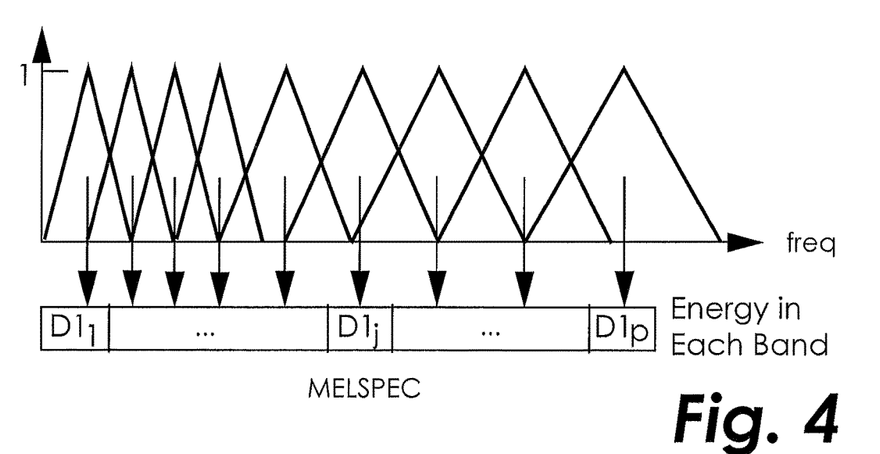
FIG. 4 is a schematic representation of the Mel scale.

The next step is to create a binary acoustic fingerprint bitmap, as indicated at step 102. The power spectrogram may be used as is, or it may be optionally transformed in order to condense the data. Any transformation technique that will condense the data may be used. To give just one non-limiting example, the Haitsma-Kalker Algorithm may be used, where a sequence of frames are created and are combined to build the acoustic fingerprint bitmap. A filter bank can be used to quantize each frame into a bit vector of size N, where N may be chosen for convenience as the number of bits in a C-style integer (8, 16, 32 or 64). In one embodiment, a Mel-scale filter bank is used to transform the power spectrum data into Mel space with (N+1) bands, as indicated at step 104. The Mel scale is a perceptual scale of pitches judged by listeners to be equal in distance from one another, as illustrated in FIG. 4.

Figure 5:
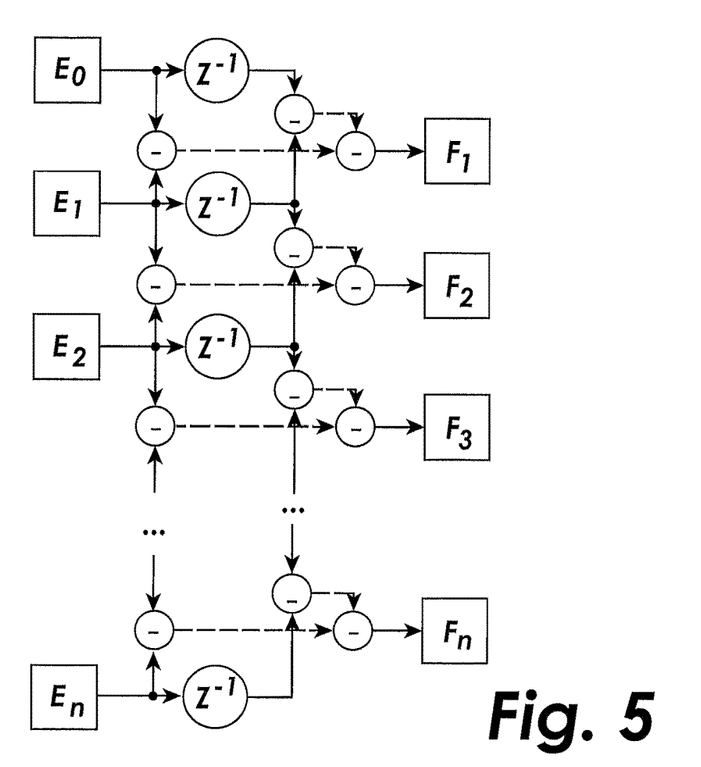
FIG. 5 is a graphical representation of the Haitsma-Kalker Algorithm.

From the sequence of (N+1)-band spectrums in Mel space, a sequence of N-bit binary fingerprint frame values based on band energy differences over successive frames is computed at step 106. In one embodiment, this is done using the Haitsma-Kalker Algorithm as follows:

$$F(n, m) = \begin{cases} 1 & \text{if } E(n, m) - E(n, m+1) - (E(n-1, m) - E(n-1, m+1)) > 0 \\ 0 & \text{if } E(n, m) - E(n, m+1) - (E(n-1, m) - E(n-1, m+1)) \leq 0 \end{cases}$$

where:
E(n,m) is the energy of frequency band m of frame n, and
F(n,m) is the mth bit of fingerprint frame n This is illustrated schematically in FIG. 5. Thus, the acoustic fingerprint is built up as a vector of N-bit integers, one integer per frame. FIG. 1C illustrates an exemplary 16-bit binary acoustic fingerprint bitmap.

For use during call progress analysis, a database is maintained that contains binary acoustic fingerprint bitmaps for known network messages. In one embodiment, during the real-time progress of an outbound call, the CPA system processes the audio stream using both a conventional AMD algorithm and an acoustic fingerprinting system. As the audio proceeds, the acoustic fingerprinting system creates binary acoustic fingerprint bitmaps of the incoming audio and compares those bitmaps to known network message bitmaps stored in a database (step 108). The CPA system identifies whether there is a match in the database of binary bitmaps (step 110), indicating that the outbound call has resulted in receipt of a known network message instead of a live speaker (step 112). If so, any output from the AMD algorithm is preempted: instead, the CPA system reports specific call progress events based on the matched acoustic fingerprint. For the general case where the acoustic fingerprint system finds no matches in the database, the conventional AMD algorithm is used to detect a greeting, and report the event of either a live speaker or an answering machine (step 114). All events are interpreted by the user of the CPA system to choose an appropriate response, such as whether to proceed or terminate the call, dispatch to an agent, adjust the dialer plan, etc. In other embodiments, the binary acoustic fingerprinting bitmap matching system is used without an additional CPA mechanism.

The Haitsma-Kalker Algorithm has been well-studied in the literature. In Haitsma and Kalker's published report of use of the Haitsma-Kalker Algorithm and the comparison of binary acoustic fingerprint bitmaps to identify three (3) second recordings of songs from a database of millions of songs (Haitsma and Kalker, "A Highly Robust Audio Fingerprinting System," *Journal of New Music Research*, Vol. 32, No. 2 (2003), pp. 211-221). Their system required a large frame size, large overlap/small step size, and large fingerprints in order to achieve good results. The parameters they used were:

Sample rate: 5 kHz
Frame duration: 370 milliseconds
Step size: 10 milliseconds
Overlap: 31/32
FFT size: 2048

The Haitsma-Kalker algorithm computes a binary acoustic fingerprint bitmap with a relatively low Signal-to-Noise ratio, with bits highly sensitive to noise and windowing artifacts. To achieve an acoustic fingerprinting system with acceptably high accuracy and low false positive rate typically requires a relatively long segment of audio (~3 seconds) with large frame size (370 ms) and large overlap between frames (31/32, or about 97%).

Such a system is computationally intensive and requires a relatively large audio sample to make reliable comparisons, both of which are undesirable in many audio matching scenarios. The present inventors have observed that many bits in a binary acoustic fingerprint bitmap are sensitive to noise and artifacts resulting from the transform into the spectral representation (windowing), especially where the energy of the signal is relatively small. A proposed solution is to mask out bits of little value due to their sensitivity to noise and windowing artifacts, and compute the error rate of the bitmap comparisons using only the bits that are in the mask (i.e., the bits that are not masked out).

Ternary Bitmap Acoustic Fingerprint Using Mask Bits to Obtain High Signal-to-Noise Ratio (SNR)

To improve the bitmap matching speed without sacrificing accuracy, one embodiment of the present invention makes the following modification to any acoustic fingerprinting algorithm that generates a binary bitmap. In the training stage where the database of known network message bitmaps is created, the methodology of FIG. 6 may be implemented. At step 200, the binary acoustic fingerprint bitmap is created for the audio segment using the same process described hereinabove with respect to FIG. 2. At step 202, in the illustrated embodiment the first sample is deleted from the audio segment (although other segment modification schemes may be employed, as discussed below), and at step 204 another binary acoustic fingerprint bitmap is created for the modified audio segment using the same process described hereinabove with respect to FIG. 2. Steps 202-204 are repeated X times (step 206), where X is the number of samples in each frame used by the acoustic fingerprinting process of FIG. 2. This process will generate X binary acoustic fingerprint bitmaps of the audio segment.

Figure 6:
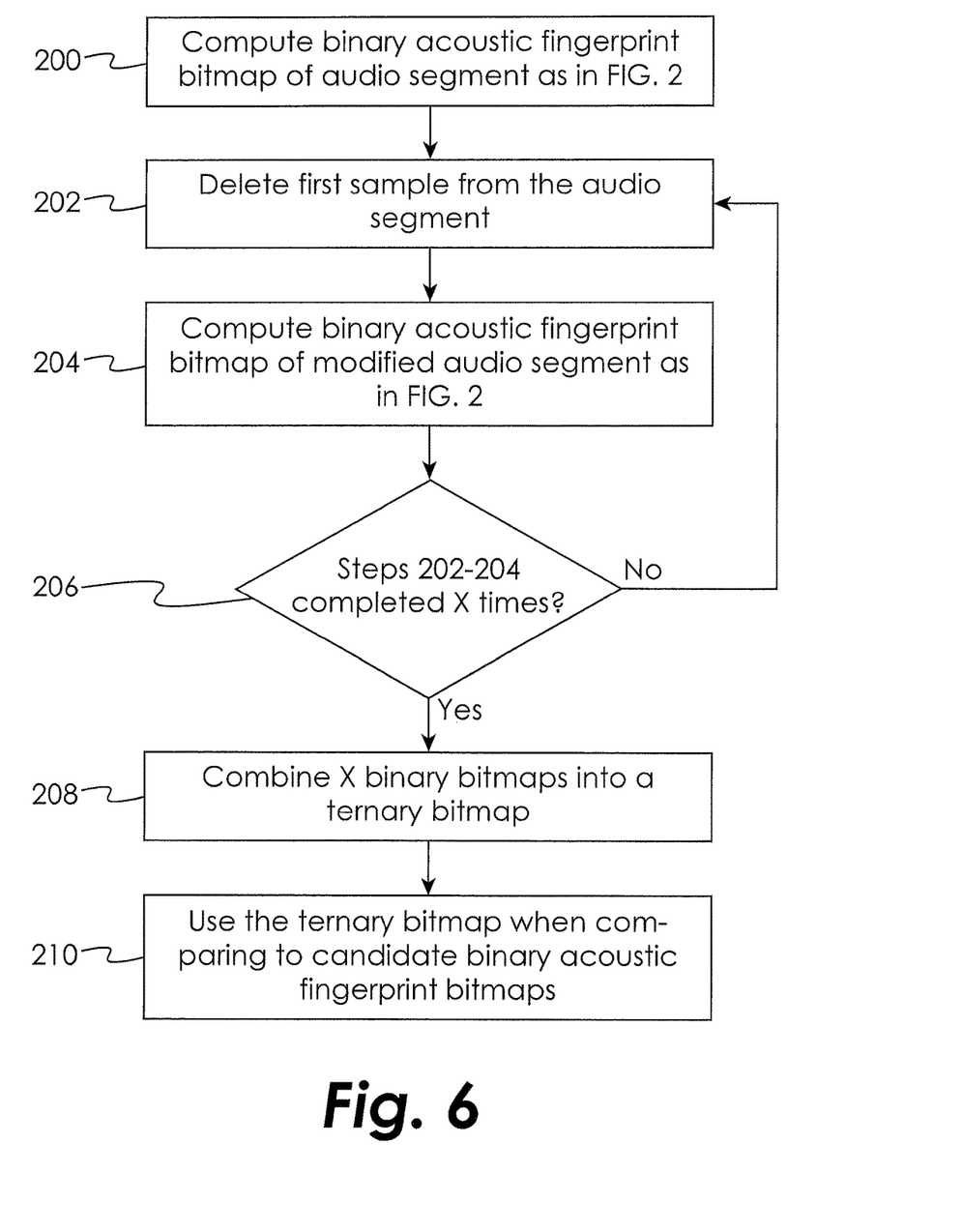
FIG. 6 is a schematic flow diagram illustrating a method for creating ternary bitmaps according to one embodiment.

The X binary acoustic fingerprint bitmaps are combined into a ternary bitmap at step 208 as follows.

If a bit is 0 in all X binary bitmaps, set the bit in the ternary bitmap to 0
If a bit is 1 in all X binary bitmaps, set the bit in the ternary bitmap to 1

Otherwise, set the bit of the ternary bitmap to * ("Don't Care")

Figure 7:
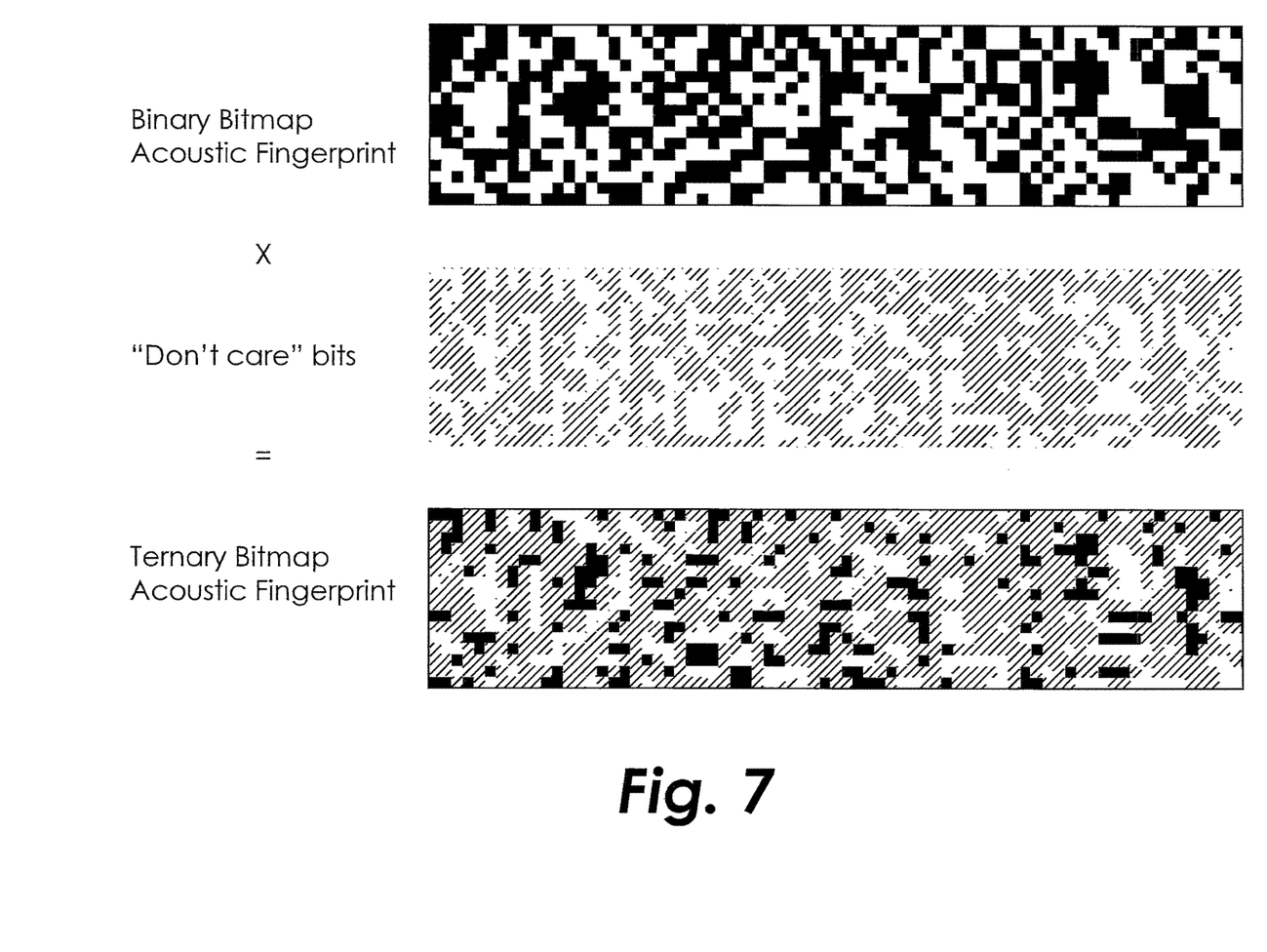
FIG. 7 is a schematic graphical representation of the creation of a ternary bitmap from a binary bitmap according to one embodiment.

The "Don't Care" bits change in the successive binary acoustic fingerprint bitmaps because they are sensitive to framing, noise, compression, and other effects that introduce signal distortion. It will be appreciated from the above description that the "Don't Care" bits may be defined in other ways, such as a predetermined percentage of bit values changing across the bitmaps, etc. If the ternary bitmap is used for bitmap comparison (step 210) and the "Don't Care" bits are ignored during the comparison process, the "Don't care" bits mask out these regions in frequency and time of the original binary acoustic fingerprint bitmap that introduce signal distortion. FIG. 7 illustrates an example comparison between a binary bitmap and its associated ternary bitmap. It will also be appreciated from the above description that the input signal can be artificially degraded before computing the acoustic fingerprint by adding noise or other artifacts commonly introduced by the communication channel in order to make the acoustic fingerprint and mask more sensitive.

At runtime, these "Don't Care" bits are excluded from the evaluated "masked Hamming distance" between the candidate audio stream and the database of known fingerprints. Use of the ternary bitmap mask eliminates false negatives due to framing misalignment between the input candidate audio stream and the recordings in the database. By excluding the bits most sensitive to windowing and noise, the ternary fingerprint system is more robust than its binary counterpart, and achieves comparable accuracy and false positive rate with much fewer bits. It will be appreciated that the above steps create many fingerprints of the same signal, with the analysis window shifted by a fraction of the frame size, and those fingerprints are then used to identify which parts of the fingerprint change. Therefore, in step 202 the analysis window may be shifted by any fraction of the frame size, rather than the illustrated single-sample shift. It will additionally be appreciated that the acoustic fingerprint and ternary bitmap (mask) may be represented in ways other than as vectors of vectors where each element is a bit with a value of zero or one, but instead more generally as vectors of vectors where each element comprises numeric scores and weights (and quantized into multi-bit representations).

For example, a method for creating a weighted compressed representation of a dataset may comprise the steps of a) computing a compressed representation of the dataset; b) deleting a first number of elements from the dataset to create a modified dataset; c) computing another compressed representation of the modified dataset; d) repeating steps (b) and (c) a plurality of times to create a plurality of compressed representations; and e) combining the plurality of compressed representations into a weighted compressed representation, where each weight in the weighted compressed representation is computed as a function of the elements in the plurality of compressed representations.

In some embodiments, the compressed representation is a two-dimensional vector of first numbers. In some embodiments the first numbers are each represented with a first number of bits, where in the first number of bits may be one bit in some embodiments, and greater than one bit in other embodiments. In other embodiments, the weighted compressed representation is a two-dimensional vector of second numbers. In some embodiments the second numbers are each represented with a second number of bits. In some embodiments, the function computes each said weight as correlation coefficient of the elements in the plurality of compressed representations. In some embodiments, the correlation coefficient is computed as follows:

1) if an element is below a first predetermined threshold in a first predetermined number of the plurality of compressed representations, set the correlation coefficient to a first value;

2) if an element is above a second predetermined threshold in a second predetermined number of the plurality of compressed representations, set the correlation coefficient to a second value;

3) otherwise set the correlation coefficient to a third value.

For example, in one embodiment, the first value is +1, the second value is −1, and the third value is 0 (zero). Those skilled in the art will recognize from the present disclosure that the correlation coefficient can be any value between −1 and +1 (or any other desired number range). In the present embodiment, the values correspond to the ternary bitmap discussed herein, where a set bit is +1, a cleared bit is −1 and a Don't Care bit is 0. The thresholds can be set to any desired level. For example, the first predetermined threshold may be 1 (one) and the second predetermined threshold may be 0 (zero) in one embodiment. When computing the correlation coefficient in one embodiment, first predetermined number comprises all of the plurality of compressed representations and the second predetermined number comprises all of the plurality of compressed representations.

The methodology of FIG. 6 can be compared to the Haitsma-Kalker algorithm binary acoustic fingerprint bitmap comparison approach of FIG. 2, which computes a binary acoustic fingerprint bitmap with a relatively low Signal-to-Noise ratio, with bits highly sensitive to noise and windowing artifacts. To achieve a fingerprinting system with acceptably high accuracy and low false positive rate using this approach typically requires a relatively long segment of audio (~3 seconds) with large frame size (370 ms) and large overlap between frames ($^{31}/_{32}$, or about 97%). By comparison, the ternary acoustic fingerprint bitmap methodology disclosed herein, such as that illustrated in FIG. 6, can obtain comparable matching accuracy and precision much more efficiently, with a short segment of low-bandwidth audio (~0.25 seconds at 8 kHz), using a small frame size of 30 ms and a small frame overlap of 33%. Not only does this achieve matching in approximately $\frac{1}{12}^{th}$ the amount of time, it is much less computationally intensive and works well with low quality audio samples.

Real-Time Matching of Acoustic Fingerprints in a Database with Minimal Delay Using Exhaustive Search Most existing acoustic fingerprinting systems are not well adapted for real-time applications because they require a large segment of a source audio stream to achieve a valid match. The requirement imposes a time delay of several seconds from the beginning of the matched segment before a matching fingerprint can be confirmed. However, to use fingerprinting in real-time in tandem with other signal processing algorithms such as conventional AMD, the fingerprinting system must identify whether a match is likely within a fraction of a second. To achieve minimal delay, the present inventors propose an approach using an optimized exhaustive search to match an audio stream in real-time against a database on the order of thousands of fingerprints.

Figure 8:
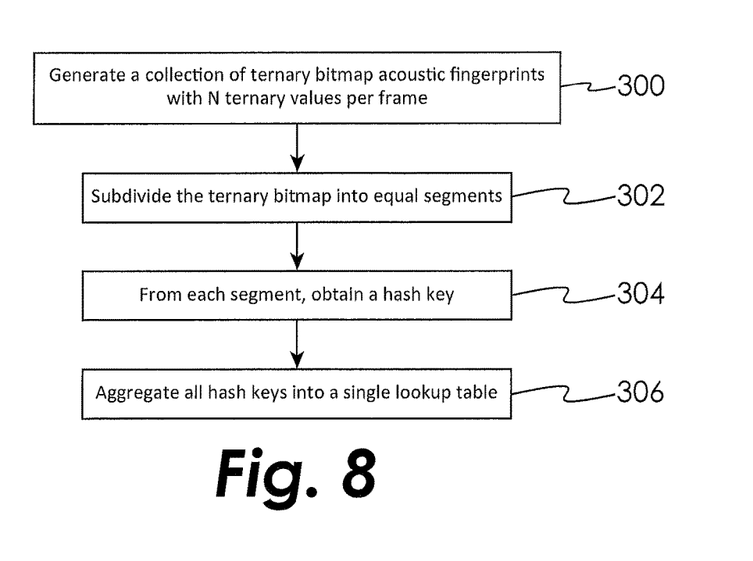
FIG. 8 is a schematic flow diagram of the creation of a hash key from a ternary bitmap according to one embodiment.
Figure 9:
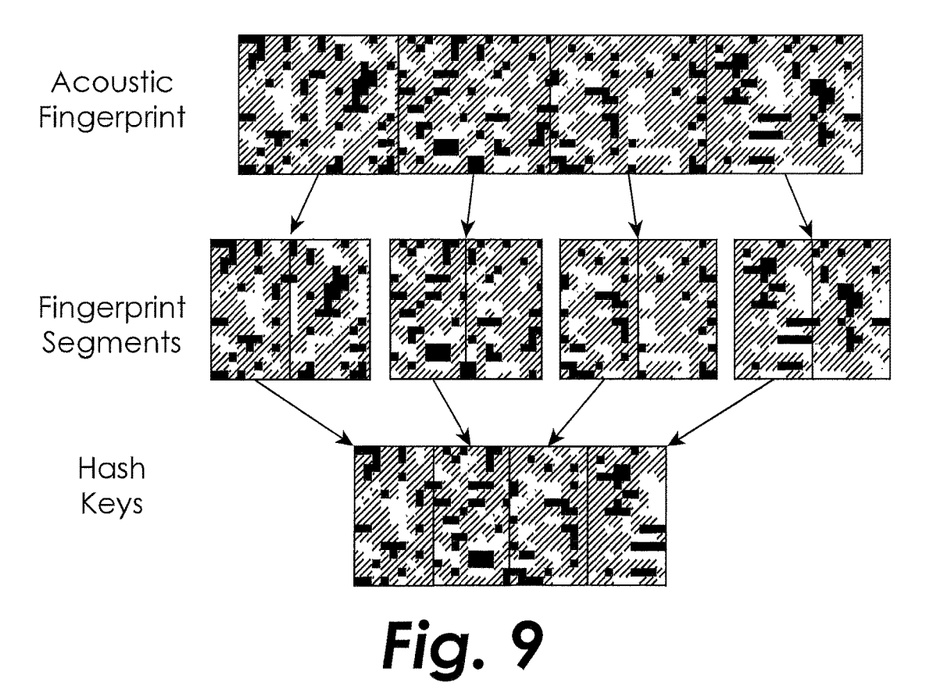
FIG. 9 is a graphical representation of the process of FIG. 7.

As shown in FIGS. 8 and 9, during preprocessing a collection of ternary acoustic fingerprint bitmaps, one for each audio object to detect, with N ternary values per frame, is generated (step 300). For each fingerprint, the ternary bitmap is subdivided into a plurality of equal segments (step 302). In one embodiment, the ternary bitmap is subdivided into four equal segments as shown in FIG. 9. From each segment, a hash key is obtained (step 304) by extracting the ternary values from 128/N frames of the subdivided fingerprint, for a total of 128 ternary values in each hash key (i.e., a 128-bit ternary hash key). It will be appreciated that the hash key may have fewer or a greater number of values. All of the hash keys thus obtained from the ternary acoustic fingerprint bitmaps are then aggregated into a single lookup table (step 306). The selection of hash keys from various segments of the acoustic fingerprint allows a match to be made even if the candidate audio stream is an interrupted recording and the beginning of the recording is not received. For example, if using this methodology for identifying samples of music, the person wishing to identify a song may not have (and most likely did not) start recording a sample of the song to be identified until sometime after the song started playing. Use of hash keys from different segments of the acoustic fingerprint allows the system to still make a match between the candidate audio stream and the acoustic fingerprints in the database.

Figure 10:
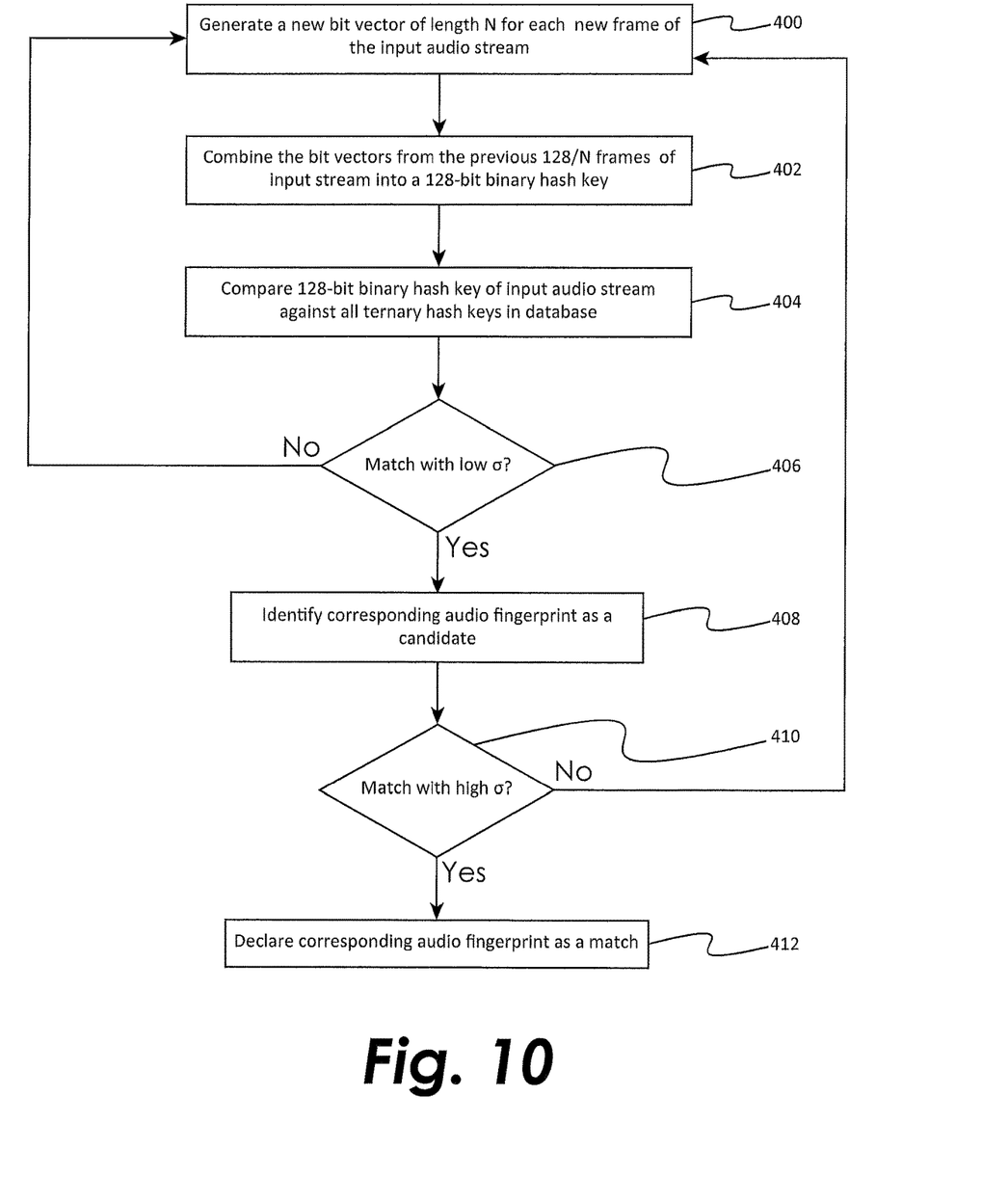
FIG. 10 is a schematic flow diagram of a matching procedure using hash keys according to one embodiment.

FIG. 10 illustrates one embodiment of a matching procedure that may be used at runtime after the lookup table of hash keys has been assembled. For each new frame of the input audio stream, a binary bitmap acoustic fingerprinting algorithm is used to generate a new bit vector of length N (step 400). The bit vectors from the previous 128/N frames of the input audio stream are combined into a 128-bit binary hash key for lookup (step 402). The current 128-bit binary hash key of the input audio stream is compared against all of the ternary hash keys in the lookup table by computing the masked Hamming distance (step 404). On modern microprocessors, this calculation can easily be parallelized and optimized with Single-Instruction-Multiple-Data instructions (such as the SSE or AVX SIMD instruction set extensions to the Intel x86 microprocessor architecture) and/or the "population count" instruction. If any hash keys in the lookup table match (step 406) with a sufficiently low masked Hamming distance, the audio fingerprint corresponding to the hash key is identified as a "candidate" (step 408). The threshold bit error rate (BER) for establishing a candidate may be based on a relatively low value of candidate (e.g., 3 standard deviations, although other thresholds may be used). If the overall BER for a candidate exceeds a relatively large value of $\sigma_{notify}$, (e.g., 9 standard deviations, although other thresholds may be used) (step 410) this candidate is determined to be a match (step 412). If no match has been determined, the process returns to step 400 where the next frame is used to generate a new bit vector of length N. By continuing to analyze subsequent frames, the process is able to resolve all candidates as a match or non-match, based upon where the masked Hamming distance falls with respect to the thresholds.

Method for Extracting Fingerprints for Common Recordings from Large Audio Collections As will be appreciated from the above description, systems and methods are provided for matching an audio sample to a database of known audio recordings. The systems and methods described above are computationally efficient and are able to identify a match with an acoustic fingerprint in a database, but a problem remains in how to efficiently identify the audio recordings that will be represented by acoustic fingerprints in the database. The methodology described herein below for doing so is discussed in the context of a telephonic contact center; however, those skilled in the art will recognize from the present disclosure that the methodology may be applied to compiling fingerprint databases relating to any type of source audio, images, or other types of data.

A sizable campaign from a contact center may generate thousands of digital recordings of outbound calls each day. From this recording collection, the objective is to extract all audio segments containing call progress events of interest, in order to assist CPA in future call campaigns. For example, many calls in a campaign are dialed to numbers on the same network or sub-network, which plays an identical recorded greeting for each subscriber. In the absence of an automated data driven technique, the large volumes of data must be listened to by a human subject, to identify candidate segments from which acoustic fingerprints may be extracted. The present inventors propose an offline process to automatically identify common acoustic recordings in a large collection of recordings, so they may be detected in future call campaigns to improve the accuracy of CPA. The process used for automated identification of fingerprints in our invention is illustrated schematically in FIG. 11.

Figure 11:
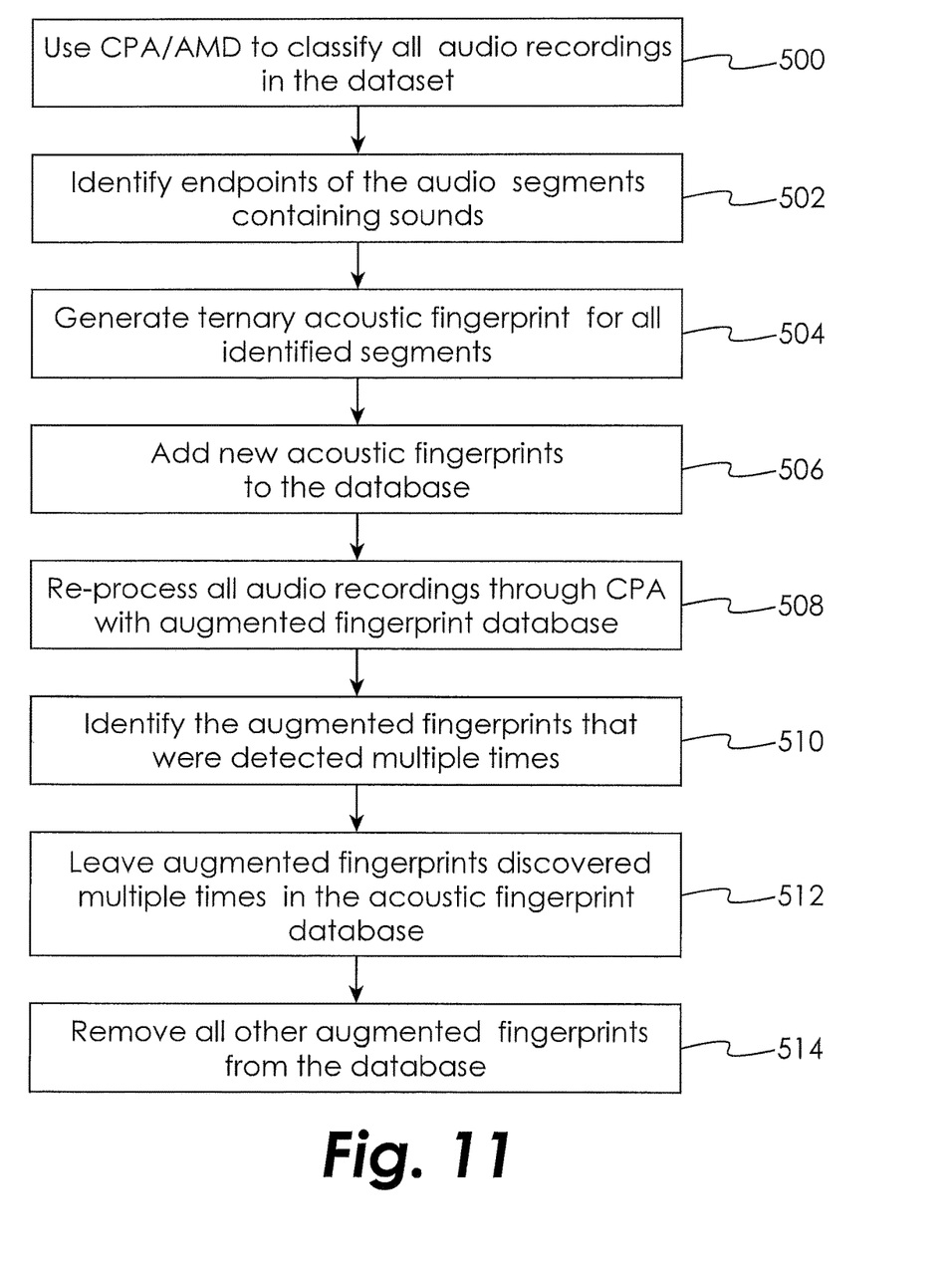
FIG. 11 is a schematic flow diagram of a method for extracting fingerprints for common recordings from large audio datasets according to one embodiment.

At step 500, the CPA system, combined with AMD and acoustic fingerprinting (if the database already contains acoustic fingerprints for some known recordings), is used to classify all audio recordings in the collection based on events detected therein. For all audio recordings classified as a live speaker or answering machine using conventional AMD, the endpoints of the audio segments that do not comprise silence, background noise, or simple tones are identified at step 502. For example, audio segments containing speaking patterns, music, non-speech signals, etc. are identified at step 502. At step 504, a ternary acoustic fingerprint bitmap is generated for all identified segments using the methodology described hereinabove (it will be appreciated that a binary acoustic fingerprint bitmap can be used instead of the ternary bitmap). These new acoustic fingerprints are added to the acoustic fingerprint database at step 506. All of the audio recordings in the collection are then re-processed through the CPA/AMD system using the newly-augmented ternary acoustic fingerprint database at step 508. At step 510, the system identifies the augmented fingerprints that are not unique and were detected multiple times (i.e., a recording in the collection being processed matched multiple ones of the augmented acoustic fingerprints, indicating that these are acoustic fingerprints of recordings that were encountered multiple times in the collection). Any acoustic fingerprints discovered multiple times are likely candidates for a call progress event of interest, and are therefore left in the acoustic fingerprint database at step 512 for use in future CPA tasks. All of the other augmented fingerprints (i.e., those new acoustic fingerprints that were not detected multiple times) are removed from the database at step 514, since they represent unique audio segments of vocal utterances, and therefore cannot be determined to be recorded network messages. In this way, an automated system may be used to look through a large collection of recordings (or images or other data) and extract therefrom fingerprints of recordings that were encountered multiple times. This methodology allows the acoustic fingerprint database to be built automatically and continuously updated to account for new network messages that may be brought on line by the various telephone companies.

As can be seen from the above description, the various embodiments allow for the matching of input audio segments with known audio segments in a database. The audio segments may originate from any source and contain any type of audio, such as speech, tones, music, or any other audio that is desired to be recognized. In an illustrative embodiment, the use of the presently disclosed systems and methods was described in conjunction with recognizing known network message recordings encountered during an outbound telephone call. However, those skilled in the art will recognize that the disclosed systems and methods will find application in recognition of any type of two- or more-dimensional dataset, such as any form of audio, image, or other type of data.

While the organization of steps, software blocks, data and data structures have been illustrated as clearly delineated, a person skilled in the art will appreciate that the delineation between steps, blocks and data is somewhat arbitrary. Numerous other arrangements of steps, software blocks and data are possible.

Finally, it will be understood that the invention is not limited to the embodiments described herein which are merely illustrative of several embodiments for carrying out the invention, and which are susceptible to modification of form, arrangement of parts, steps, details and order of operation. The invention, rather, is intended to encompass all such modifications within its spirit and scope, as defined by the claims.

What is claimed is:

1. A method for extracting acoustic fingerprints for common recordings comprising the steps of:
   a. identifying segments of interest from a dataset of recordings by a means of classification using a Call Progress Analysis system;
   b. generating acoustic fingerprint candidates for said identified segments, each of the acoustic fingerprint candidates being computed from a plurality of power spectrums of the corresponding one of the identified segments, each of the power spectrums comprising a plurality of frequency bands;
   c. adding said acoustic fingerprint candidates to an acoustic fingerprint database;
   d. repeating steps (a) and (b) to process the recordings in the dataset using the acoustic fingerprint database containing said acoustic fingerprint candidates added in step (c); and
   e. removing said acoustic fingerprint candidates from the acoustic fingerprint database that were not detected a specified number of times.

2. The method of claim 1, wherein said segments of interest comprise audio segments that do not comprise any of: silence, simple tones, background noise, and known fingerprints.

3. The method of claim 1, wherein the specified number of times is 2.

4. A method for extracting fingerprints for common data comprising the steps of:
   a. identifying subsets of interest from a dataset by means of classification using a Call Progress Analysis system;
   b. generating fingerprint candidates for said subsets, each of the fingerprint candidates being computed from a plurality of power spectrums of the corresponding one of the identified segments, each of the power spectrums comprising a plurality of frequency bands;
   c. adding said fingerprint candidates to a fingerprint database;
   d. repeating steps (a) and (b), to process the dataset using the fingerprint database in step (c) containing the additions of fingerprint candidates; and
   e. removing said fingerprint candidates from the database that do not meet a specified criteria.

5. The method of claim 4, wherein said common data comprises audio recordings.

6. The method of claim 4, wherein said subsets of interest comprise audio subsets that do not comprise any of: simple tones, background noise, and known fingerprints.

7. The method of claim 4, wherein said criteria is the number of times the fingerprint matches.

8. The method of claim 7, wherein said number of times is 2.

* * * * *